United States Patent
Sakurabayashi et al.

(10) Patent No.: US 7,492,569 B2
(45) Date of Patent: *Feb. 17, 2009

(54) CAPACITOR CELL, SEMICONDUCTOR DEVICE AND PROCESS FOR MANUFACTURING THE SAME

(75) Inventors: Taro Sakurabayashi, Kanagawa (JP); Toshikazu Kato, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 76 days.

This patent is subject to a terminal disclaimer.

(21) Appl. No.: 11/477,383

(22) Filed: Jun. 30, 2006

(65) Prior Publication Data

US 2006/0249812 A1  Nov. 9, 2006

Related U.S. Application Data

(62) Division of application No. 10/845,197, filed on May 14, 2004, now Pat. No. 7,161,792.

(30) Foreign Application Priority Data

May 16, 2003  (JP) .............................. 2003-139239

(51) Int. Cl.
*H01G 4/005* (2006.01)
(52) U.S. Cl. .................. 361/303; 361/302; 361/305; 361/328; 361/306.2; 361/330; 365/149; 365/230.01; 365/189.09

(58) Field of Classification Search ......... 361/302–305, 361/306.1, 306.2, 306.3, 311–313, 328–330; 365/149, 233

See application file for complete search history.

(56) References Cited

U.S. PATENT DOCUMENTS

| 5,029,128 | A | 7/1991 | Toda |
| 5,439,840 | A | 8/1995 | Jones et al. |
| 5,471,418 | A | 11/1995 | Tanigawa |
| 5,801,412 | A | 9/1998 | Tobita |
| 6,680,501 | B2 * | 1/2004 | Ito et al. ...................... 257/296 |
| 6,756,652 | B2 * | 6/2004 | Yano et al. .................. 257/508 |
| 6,785,157 | B2 * | 8/2004 | Arimoto et al. ............. 365/149 |
| 7,161,792 | B2 * | 1/2007 | Sakurabayashi et al. .... 361/303 |

FOREIGN PATENT DOCUMENTS

| JP | 6-236923 A | 8/1994 |
| JP | 11-191611 A | 7/1999 |
| JP | 2000-332201 A | 11/2000 |
| JP | 2002-313929 A | 10/2002 |
| JP | 2003-86699 A | 3/2003 |

* cited by examiner

*Primary Examiner*—Nguyen T Ha
(74) *Attorney, Agent, or Firm*—Sughrue Mion, PLLC

(57) ABSTRACT

A capacitor cell for reducing noise in a high drive cell includes a plurality of vias for supplying power to an interconnection layer positioned over the capacitor cell from an upper interconnection layer, so that the resistance of the power supply path is reduced.

2 Claims, 16 Drawing Sheets $C = Cg/2n$
$R = Rsd/n$

CAPACITOR CELL, SEMICONDUCTOR DEVICE AND PROCESS FOR MANUFACTURING THE SAME

This is a divisional of application Ser. No. 10/845,197, filed May 14, 2004 now U.S. Pat. No. 7,161,792, and claims priority from Japanese Patent Application No. 2003-139239, filed May 16, 2003, the entire disclosures of which are incorporated herein by reference.

FIELD OF THE INVENTION

The present invention relates to a semiconductor device and a method of manufacturing and designing the same and in particular to a semiconductor device having a power supply enhancement circuit which is preferable for power supply to a cell of high driving capability, and a method of manufacturing and designing the same.

BACKGROUND OF THE INVENTION

In order to achieve the layout freedom of a cell (also termed as a macro cell or a primitive cell) in a power supply interconnection structure of a semiconductor integrated circuit, the thickness and width of a power supply line, the number of power supply vias, the distance between power supply lines are determined in consideration of power supply to a high drive cell such as a buffer having a high driving capability and the like.

There has been known a power supply interconnection structure of a semiconductor for making it possible to layout a driver circuit having a high driving capability without increasing the chip area, in which a macrocell such as a clocked driver having large fan-out is disposed below a power supply line (refer to, for example, Patent specification 1).

Recently, an on-chip decoupling capacitor which uses a MOS gate capacitor in a semiconductor integrated circuit has been adopted as a decoupling capacitor provided between a power supply line and the ground line to reduce power supply noise. In association with an increase in operation frequency and an increase in power supply current of a semiconductor integrated circuit, the capacitance of the on-chip decoupling capacitor is increased, resulting in an increase in area which is required for a capacitor on a chip. In order to overcome such a problem, a structure decoupling capacitor which achieves an improvement in area efficiency has been proposed (refer to, for example, Patent specification 2). This structure of decoupling capacitor has an ESD (electrostatic discharge) immunity without requiring the step for forming a resistor for preventing ESD. As will be described hereafter, a capacitor cell which is used in embodiments of the present invention uses the decoupling capacitor which is described in the above-mentioned Patent specification 2 as a capacitor element structure.

A structure which reduces the number of steps required for enhancing the power supply line and does not cause an increase in chip size in a power supply device for a semiconductor integrated circuit has been known (refer to, for example, Patent specification 3). This power supply device for a semiconductor integrated circuit comprises an internal integrated circuit area which operates at a reference supplied voltage; a voltage drop analyzing means which can detect a drop of voltage which is caused by the internal integrated circuit area; a step up converter circuit which can apply a voltage higher than said reference supplied voltage to the internal integrated circuit area; and feeding back means for feeding back to the step up converter circuit the voltage drop caused by the internal integrated circuit area, which is detected by the voltage drop analyzing means, so that the voltage drop caused by the internal integrated circuit falls within a designed tolerance range. Cited Patent Specification 3 describes that a problem of the voltage drop can be overcome by applying stepped up a reference supplied voltage to the internal integrated circuit, if the analyzing means shows that the voltage drop after the interconnection is disposed is lower than the designed tolerance range (margin), that the number of steps required for enhancing the power supply line can be reduced and that an increase in chip size is not caused. However, the structure of the power supply enhancing circuit of the Patent specification 3 includes a voltage drop detecting circuit and feeding back circuit for supplied voltage and the like, which brings an increase in circuit scale.

[Patent document 1]
Japanese Patent Kokai Publication No. JP-A-6-236923 (Page, 5, FIG. 4)

[Patent document 2]
Japanese Patent Kokai Publication No. JP-P2003-86699A (FIG. 2)

[Patent document 3]
Japanese Patent Kokai Publication No. JP-P2002-313929A (Page 4, FIG. 1)

SUMMARY OF THE DISCLOSURE

Recently the advance in process miniaturization (i.e., reduction in minimum device dimension) in manufacturing a semiconductor integrated circuit, makes an interconnection resistance in the semiconductor integrated circuit larger, so that voltage drop (IR-drop) in the interconnection resistance becomes more marked. In a high drive cell such as a buffer of high driving capability, current which flows through a power supply path becomes larger, so that the voltage drop in the power supply path to the high cell increases.

The power supply path required for a high drive cell has the thickness, line width, the number of power supply vias, and the distance between power supply lines, each of which is larger than that of the power supply path for a cell having an average driving capability. The structure of a power supply interconnection for supplying power to a high drive cell would become excessive for the cell having an average driving capability. Furthermore, the power supply interconnection structure puts oppression to a signal interconnection area in a cell having an average driving capability, so that interconnection resource can not be efficiently used.

Accordingly, it is an object of the present invention to provide a semiconductor device, a capacitor cell and a method of manufacturing and designing the same, which allows efficient mitigation of resistance to prevent the voltage drop caused by power supply paths (IR-drop).

It is another object of the present invention to provide a semiconductor device, capacitor cell, and a method of manufacturing and designing the same, which makes it possible to enhance the power supply of high drive cell and to efficiently use interconnection resource while suppressing an increase in chip area and circuit scale.

The above and other objects are attained by capacitor cell in one aspect of the present invention which solves the problem comprises a path for mitigating the resistance of a power supply path on an interconnection layer at an area corresponding to the area where a capacitor cell for enhancing the power supply (decoupling capacitor cell) is disposed over the capacitor cell. The inventors have found that a vacant area (space) of a interconnection layer above a capacitor cell for reducing noise, which is disposed in the vicinity of a cell having a high driving capability can be advantageously used and have made the present invention based upon this finding.

With the present invention, sufficient current can be supplied to a high drive cell through a capacitor cell which constitutes a decoupling capacitor of the high drive cell while reducing IR-drop and prevents the restriction of the space of signal interconnection at an area of a cell having an average driving capability.

A semiconductor device in accordance with another aspect of the present invention comprises a capacitor cell on said semiconductor substrate, including at least one capacitor element; one interconnection layer positioned over said capacitor cell; and at least one other interconnection layer different from said one interconnection layer, on which a power supply line is disposed. At least one power supply line is disposed on said one interconnection layer at its area corresponding to said capacitor cell disposed area. Said one power supply line on said one interconnection layer is electrically connected to the power supply line corresponding to said other interconnection layer through at least one connecting via. The semiconductor device comprises a cell disposed in the vicinity of said capacitor cell having a circuit including at least one active element.

The capacitor cell according to the present invention constitutes a decoupling capacitor of said cell disposed in the vicinity of said capacitor cell. Said power supply line provided at an area where said capacitor cell of said one interconnection layer is disposed constitutes a power supply path for said cell.

A method in accordance with a further aspect of the present invention is one for laying out a cell based semiconductor device in designing thereof by using a computer in which the computer performs registering as a macrocell in a cell library, a capacitor cell including at least one capacitor element, said capacitor cell comprising at least one path for mitigating the resistance of a power supply path (referred to as "capacitor cell with a resistance mitigating path) at are area positioned on an upper layer over said capacitor element and corresponding to an area where said capacitor cell is placed. The method further comprises:

a first step; reading out information on circuit connection from a storage which stores circuit connection information; and a second step: disposing a capacitor cell with a resistance mitigating path which has been registered in said cell library in a row or column adjacent to said cell as a capacitor cell assisting in supplying power to said cell, in case the cell to be disposed in accordance with said circuit connecting information has a relatively higher driving capability.

A manufacturing method in accordance with a further aspect of the present invention comprises the steps of disposing at least one capacitor element for assisting in supplying power; and providing at least one path on over said capacitor element at an area corresponding to an area where said capacitor element is disposed, for mitigating the resistance of a power supply path.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Preferred embodiments will be described after the description of the principle of the invention. A capacitor cell according to the present invention serves to assist in supplying power and has at least one path for mitigating the resistance of a power supply path which is arranged on a interconnection layer located over the capacitor are.

In accordance with the present invention, a power supply for a high drive cell having a high current density is assisted by disposing a vias (13, 14) on interconnection layers (15, 16) arranged above an areas of a capacitor cell (10) comprising an MOS gate capacitor for assisting power supply from an upper layer and by disposing the capacitor cell (10) so that it corresponds to the higher and lower voltage power supplies (Vdd) and (Vss) of the high drive cell of high density of current.

In accordance with the present invention, enhancement of power supply can be achieved at a minimum area without giving any influence upon the inner structure of a high drive cell.

In a decoupling capacitor cell which assists power supply for a high drive cell, layers above a first metal such as second, third or fourth metal-layer layer have not been effectively utilized. The present invention reduces the resistance of a power supply path for the high drive cell by using the layers above the first metal interconnection layer to provide a connection hole (via or stacked via) from an upper layer.

Since power supply for the high drive cell is conducted from the upper layer by using an area of the upper layer above the capacitor cell in accordance with the present invention, a power supply configuration which is optimal for the chip architecture in a lower layer of a multi-layer interconnection structure can be provided without using any wasteful area.

Embodiment

Figure 1A:
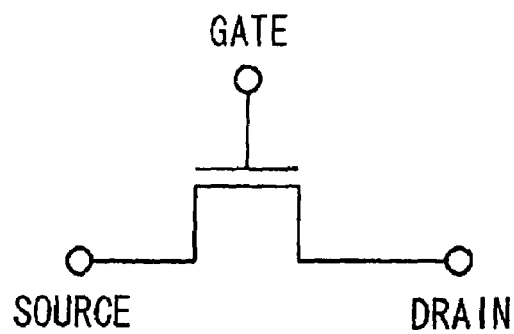
FIGS. 1A and 1B are views explaining an MOS gate capacitor (MOS capacitor)
Figure 1B:
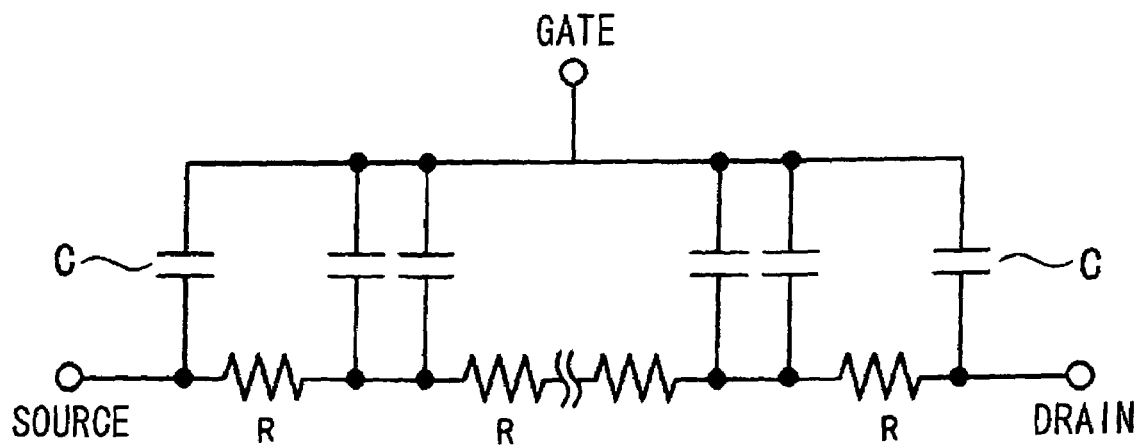

Now, embodiments of the present invention will be described with reference to drawings. A capacitor cell which is used in the embodiment of the present invention will be described. FIG. 1 is an explanatory view explaining the capacitor cell. As is well known, a capacitor which forms the capacitor cell comprises a gate insulating film formed between source and drain diffusion regions which are formed in the surface of a semiconductor substrate, and a gate electrode (polycrystalline silicon gate) which is formed to cover the gate insulating film. Since gate capacitance Cg has a channel resistance Rsd between the source and drain diffusion regions, the MOS capacitor can be represented by a known model (equivalent circuit) as shown in FIG. 1B.

The equivalent circuit comprises 2n capacitors C which are in parallel connected to each other and n resistors R which are serially connected to each other. The capacitors C has a relation $C=Cg/2$ and the resistors R has a relation $R=Rsd/n$. The higher the channel resistance becomes, the longer time it takes for charge to reach the MOS gate capacitor. The more the gate capacitance is, the longer time it takes for charge to be fully stored.

Accordingly, if the MOS capacitor has a longer gate length, current is switched before charge is fully stored in the gate capacitor, so that the capacitor is not advantageously utilized. Although charge is stored in the capacitor in the vicinity of the source and drain diffusion regions, current is switched in the intermediate area between the source and drain diffusion regions (the intermediate of the channel region) before the charge is not stored. Accordingly, excessively large gate length is not appropriate.

However, larger gate length may be preferable in some case. Larger gate length reduces the ratio of area of the source and drain and makes the efficiency of the gate area better.

In such a manner, a trade off between frequency response characteristic and area efficiency is made to determine the gate length.

Therefore, optimal design is conducted to determine such a gate length that maximizes the effective gate capacitance. Determination of the pattern shape of the gate electrode (polycrystalline silicon gate) does not constitute the gist of the invention. Any desired pattern of the MOS gate capacitor may be applied depending upon the device characteristics.

Figure 2:
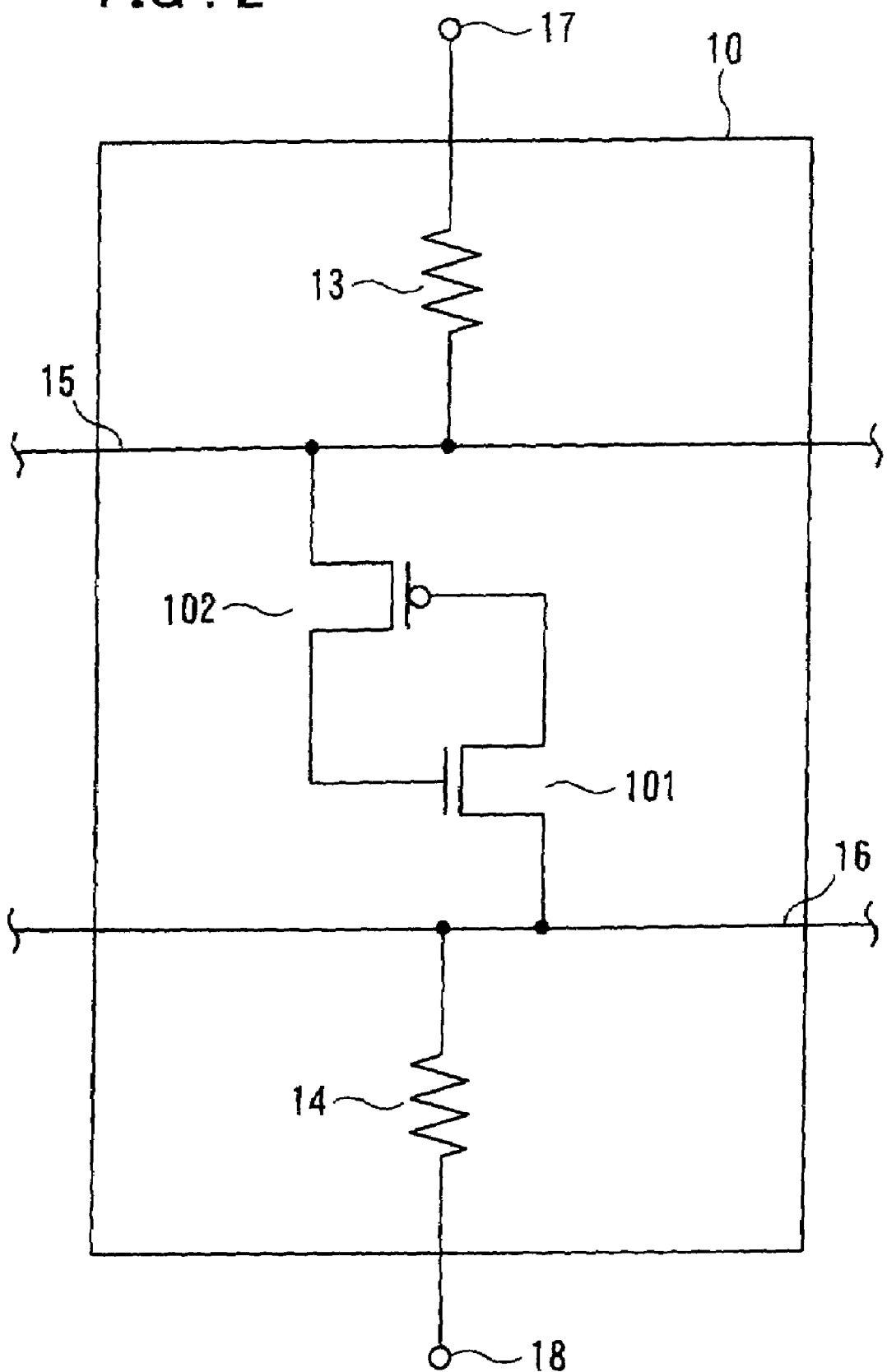
FIG. 2 is a view showing the configuration of a capacitor cell of one embodiment of the present invention.

FIG. 2 illustrates the circuit configuration of a capacitor cell of one embodiment of the present invention. Referring to FIG. 2, the MOS gate which composes a decoupling capacitor cell comprises a PMOS transistor 102 having a source diffusion region connected to a higher voltage power supply line (Vdd) 15 and an NMOS transistor 101 having a source diffusion region connected to a lower voltage power supply line (Vss) 16. The drain diffusion region of PMOS transistor 102 is connected to the gate electrode (polycrystalline silicon gate) of NMOS transistor 101 and the drain diffusion region of NMOS transistor 101 is connected to the gate electrode of PMOS transistor 102. The contact area of the source diffusion region of PMOS transistor 102 is in an ohrmic contact with, for example, the higher voltage power supply line (Vdd) of a first metal interconnection layer and then to a power supply line 17 of an upper layer through via and interconnection or stacked via (represented as resistor 13 in FIG. 2). The contact of the source diffusion region of NMOS transistor 101 is in an ohmic contact with the lower voltage power supply line (Vss) 16 of the first metal interconnection layer and then to the power supply line 18 of the upper layer through via and interconnection or stacked via (represented by resistor 14 in FIG. 2).

In such a manner, resistance reducing paths 13 and 14 are provided between the power supply lines 15 and 16 of the lower layer and the power supply lines 17 and 18 of the upper layer, respectively, in the present embodiment. In the first metal interconnection layer, a space which corresponds to the area at which the capacitor cell 10 including MOS transistors 101 and 102 formed on the substrate surface are disposed is used for the power supply line pattern in the power supply line arrangement, so that reduction in resistance of interconnection of higher and lower voltage power supply lines is achieved. Although a circuit arrangement including a capacitor element between the higher and lower voltage interconnections 15 and 16 is illustrated for brevity, it is as a matter of course that the capacitor cell may include a plurality of capacitor elements (capacitor array).

The capacitor cell which is shown in FIG. 2 is manufactured by forming MOS transistors 101 and 102 constituting a capacitor element which assist power supply, on the semiconductor substrate and providing a layer of the upper layer of the capacitor element with paths 13 and 14 for mitigating the resistance of the power supply path.

The decoupling capacitor as shown in FIG. 2 has MOS transistor 101 and PMOS transistor 102 which both serve as gate capacitors and resistors for coping ESD, and is excellent in area efficiency. For more details of MOS gate capacitor shown in FIG. 2, refer to cited Patent specification 2.

Figure 3:
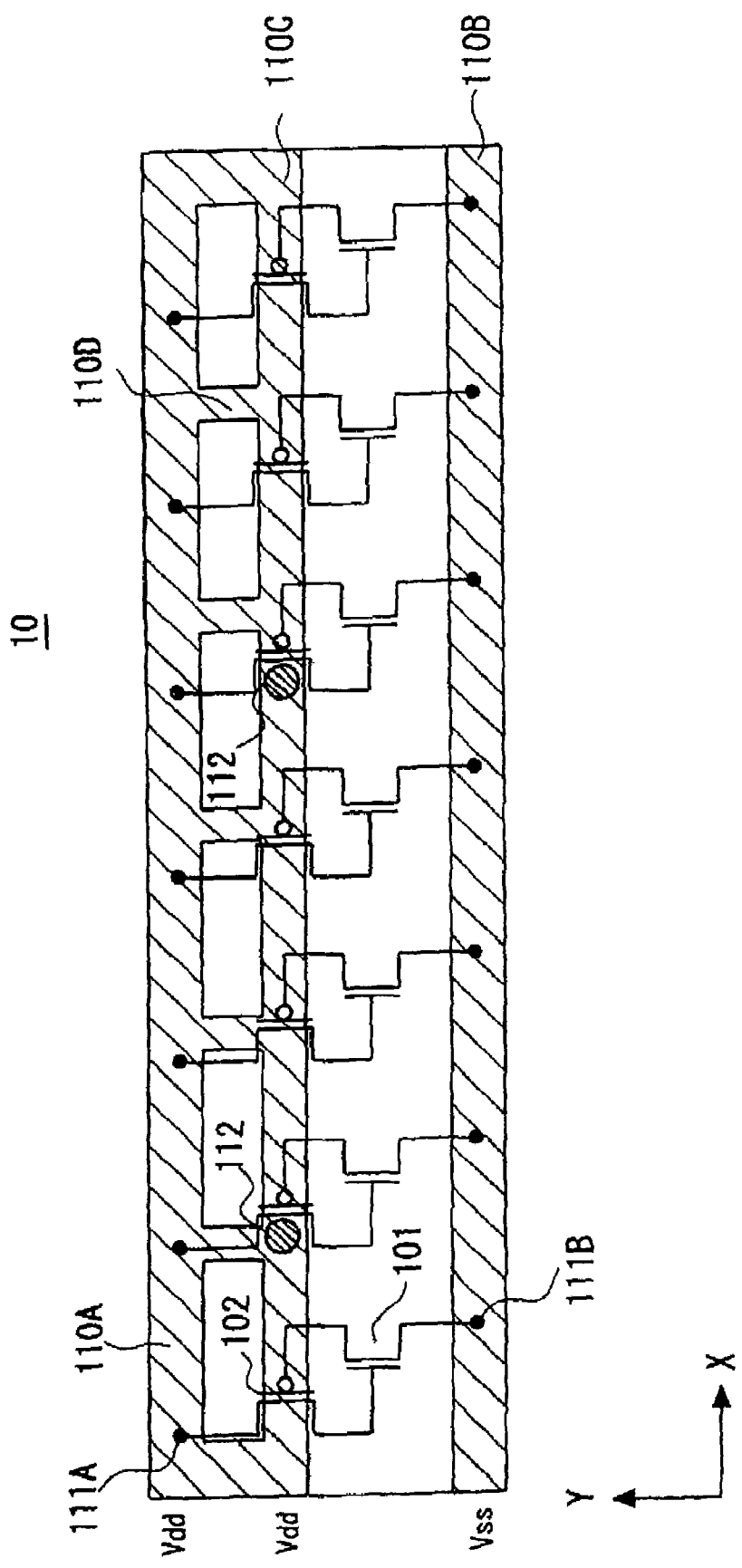
FIG. 3 is a view showing a layout pattern of an interconnection layer on the capacitor cell of one embodiment of the present invention.
Figure 4:
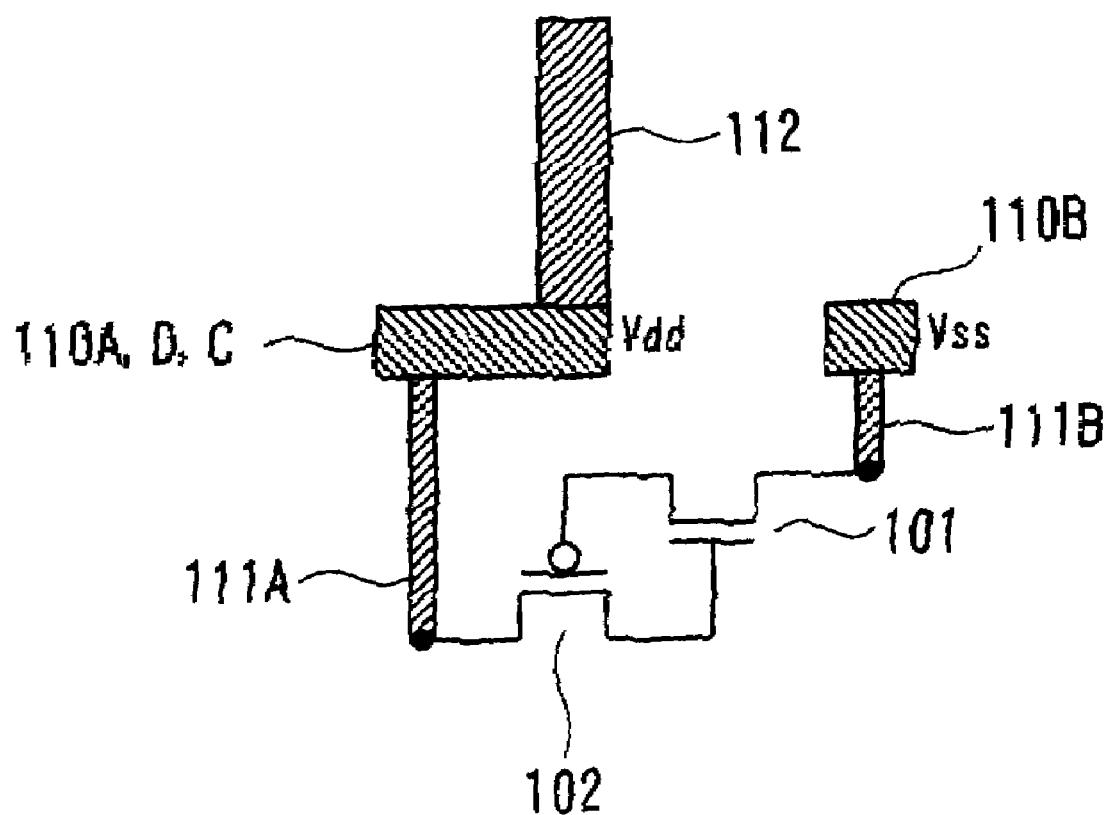
FIG. 4 is a view schematically showing the configuration and arrangement of vias and contacts of FIG. 3.

FIG. 3 is a view showing the layout of one embodiment of the present invention. In the drawing, the layout pattern of (Vdd enhancement pattern) which is provided on the metal interconnection layer (for example, first metal interconnection layer) right above the capacitor cell is illustrated. FIG. 4 is an explanatory view schematically showing the sectional structure of vias as viewed in an X-axis direction from one side of FIG. 3 (for example, left side).

In the present embodiment, a power supply line pattern as shown in FIG. 3 is provided as power supply enhancement path of higher voltage power supply Vdd for reducing the electric resistance of the power supply path of higher voltage power supply Vdd.

Referring now to FIGS. 3 and 4 in more detail, the source diffusion region of the PMOS transistor 102 and the source diffusion region of the NMOS transistor 101 are connected to the higher voltage power supply line (Vdd) 110A and the lower voltage power supply line (Vss) 110B which are disposed on the first metal interconnection layer via the contacts (contact holes) 111A and 111B, respectively. The PMOS transistor 102 and the NMOS transistor 101 compose a gate capacitor. The power supply line 110c of the higher voltage power supply Vdd is connected to an upper interconnection layer (not shown) through a via 112. The capacitor cell 10 of the present embodiment comprises a plurality of vias (through holes) by which the power supply line 110c disposed on the first metal interconnection layer just above the gate capacitor cell are connected in parallel to the power supply line Vdd (not shown) of the upper interconnection layer. Such a circuit arrangement reduces the resistance of the power supply path. Hereinafter, the power supply line of the first metal interconnection layer may be represented only as a reference numeral "110" by omitting "A" or "B" from the reference numerals 110A, 110B which represent the power supply lines of the first metal interconnection layer.

In the embodiment shown in FIG. 3, the power supply line pattern of the first metal interconnection layer over the capacitor cell 10 has two-row interconnection patterns 110A and 110C which extends in an X-axis direction in a parallel manner as power supply line of the higher voltage power supply Vdd. The two-row power interconnection patterns 110A and 110C are connected to each other in a plurality of positions by means of patterns 110D which extend in a column direction (Y axis) and are spaced at a given spacing in an X-axis direction, so that reduction in interconnection resistance between the interconnection patterns 110A and 110B is achieved. In the embodiment shown in FIG. 3, the interconnection patterns 110A, 110C and 110D constitute a grid-like pattern having two rows and seven columns. The lower voltage power supply line (Vss) pattern 110B is one row and is separated from the interconnection patterns 110A, 110C and is not electrically conductive (not electrically connected) with the interconnection patterns 110A and 110C. The higher voltage power supply line pattern is not limited to the grid-like pattern having two rows and seven columns and may have any numbers of rows and columns and may be a pattern having any shape such as inclined shape (the same is applied to the embodiments which will be described hereafter). The arrangement of FIG. 3 may be used for enhancing the lower voltage power supply Vss. In this case, the lower power supply voltage Vss is applied to the power supply lines 110A and 110C in FIG. 3 the higher power supply voltage Vdd is applied to while the power supply line 110B in FIG. 3.

Figure 5:
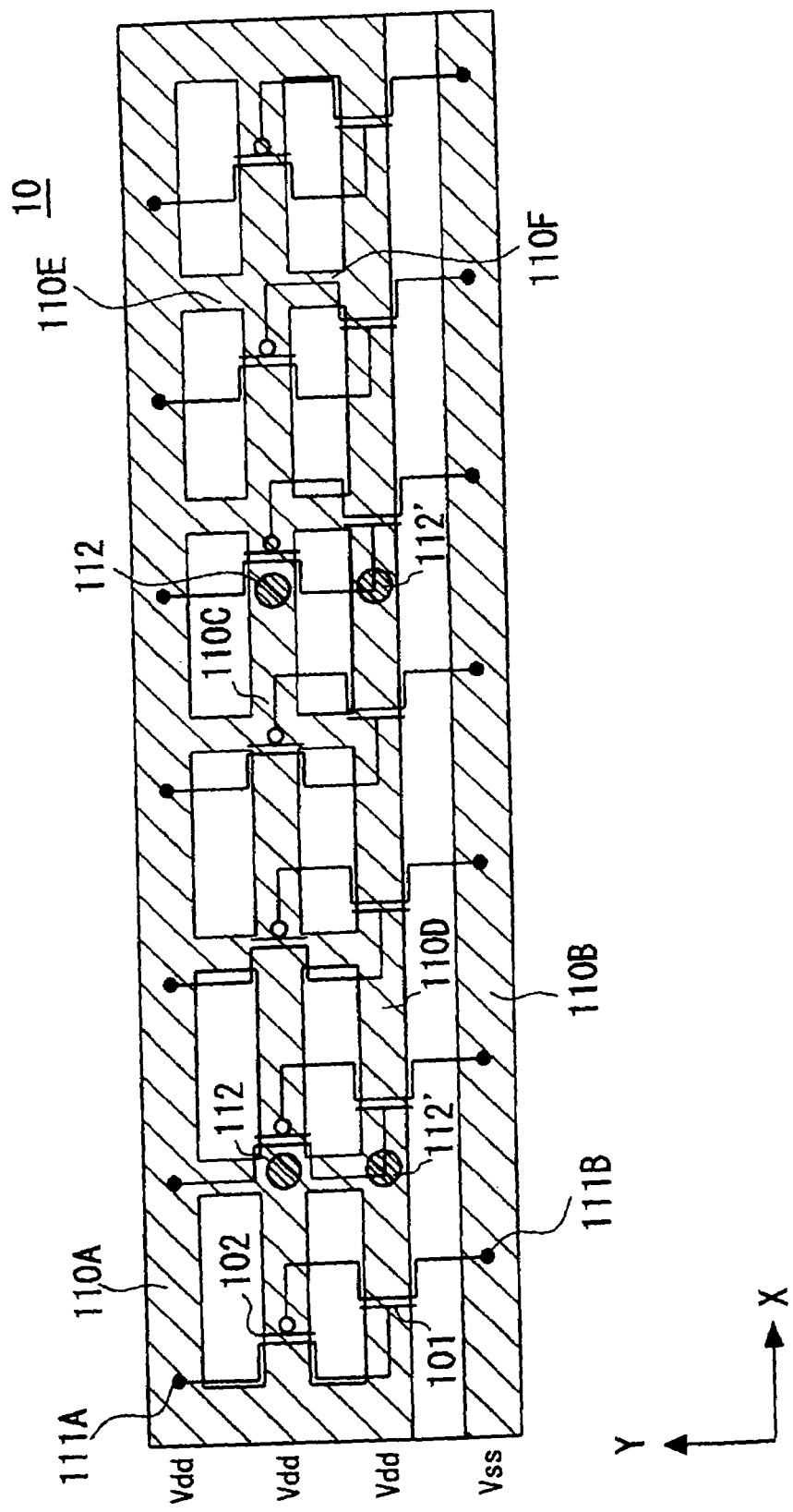
FIG. 5 is a view showing a layout pattern of a interconnection layer on the capacitor cell of a second embodiment of the present invention.
Figure 6:
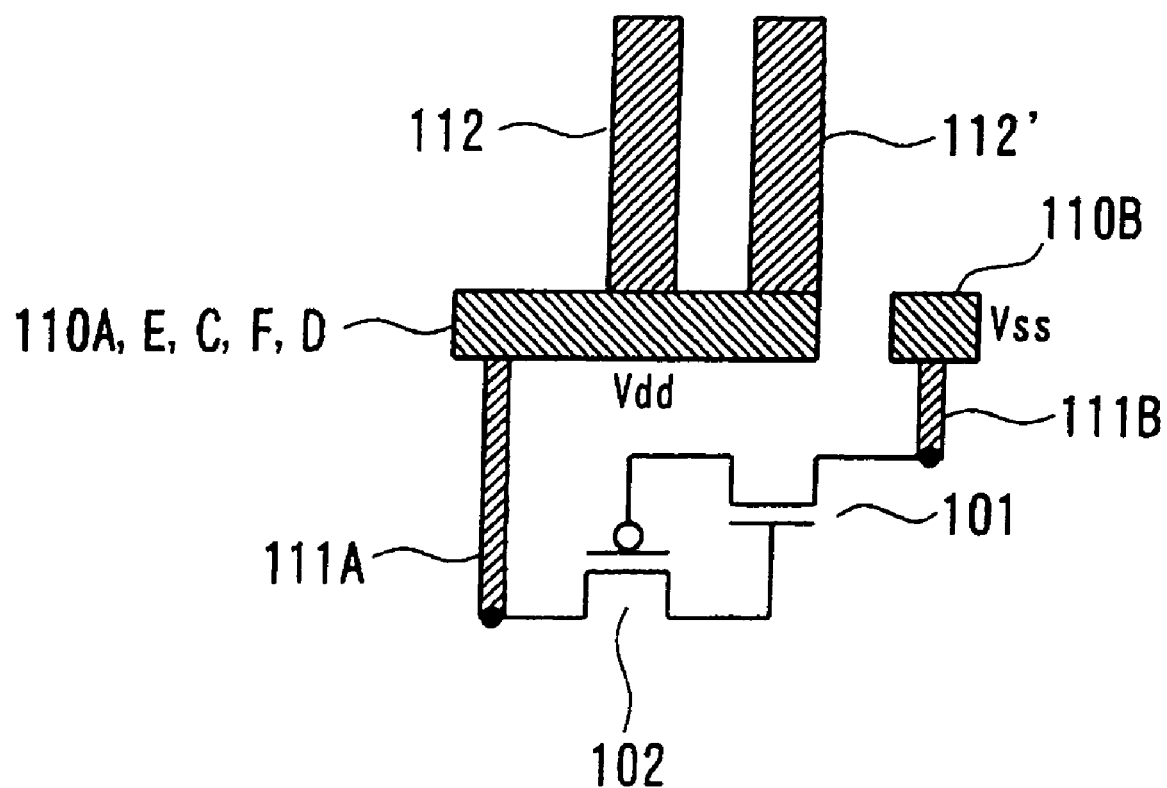
FIG. 6 is a view schematically showing the configuration and arrangement of vias and contacts of FIG. 5.

Now, a second embodiment of the present invention will be described. FIG. 5 is a view showing an arrangement of the second embodiment of the present invention. A layout pattern (Vdd enhancement pattern) of the power supply line provided on a metal interconnection layer (for example, first metal interconnection layer) just above the capacitor cell is illustrated in FIG. 5. FIG. 6 is an explanatory view schematically showing the sectional structure of vias as viewed in an X-axis direction from the left side of FIG. 5.

Referring now to FIG. 5, the power supply line pattern of the first metal interconnection layer above the capacitor cell 10 comprises three rows of interconnection patterns 110A, 110C and 110D which extend along an x-axis direction and are spaced from each other at a given interval as a pattern for enhancing the higher voltage power supply Vdd and comprises vias (through-holes) 112 and 112' for connecting the interconnection patterns 110C and 110D on the second and third rows with the upper layer power supply line (not shown) respectively. The interconnection patterns 110A and 110C on the first and second rows of the higher voltage power supply Vdd are connected to the interconnection patterns 110A and 110C on the second and third rows of the power supply Vdd by a plurality of interconnection patterns 110E and 110F which are spaced at a given space in an X-axis direction and extend in a Y-axis direction, respectively, so that a grid-like pattern having three rows and seven columns is formed.

The interconnection patterns 110C and 110D (which are electrically connected to each other through the interconnection patterns 110F) on the second and third rows of the higher voltage power supply Vdd are provided with vias 112 and 112' respectively, in the same X coordinate position. A plurality of pairs of vias 112, 112' are separated to each other at a given space in an X-axis (row) direction on the power supply lines 110C, 110D. In the embodiment shown in FIG. 5, the lower voltage power supply line (Vss) pattern which is separated from the interconnection pattern 110C is one row.

As shown in FIGS. 5 and 6, the source diffusion region of the PMOS transistor 102 and the source diffusion region of the NMOS transistor 101 which constitute a MOS gate capacitor are connected to the higher voltage power supply line (Vdd) 110A and the lower voltage power supply line (Vss) 110B which are disposed on the first metal interconnection layer via contacts 111A and 111B, respectively. The higher voltage (Vdd) power supply lines 110C and 110D are connected to the upper layer power supply lines (not shown) through the vias 112 and 112', respectively, the power supply line 110A is at the same potential as that of the power supply lines 110C and 110D. In such a manner, the present embodiment comprises a plurality of vias extending in an x-axis and y-axis directions as power supply paths of the higher voltage Vdd to reduce the resistance of the power supply paths. The arrangement shown in FIG. 5 may be used for enhancing the lower voltage power supply Vss. In this case, the power supply lines 110A, 110C and 110D is supplied with lower voltage power Vss while power supply line 110B of FIG. 5 is supplied with higher voltage power Vdd.

Figure 7:
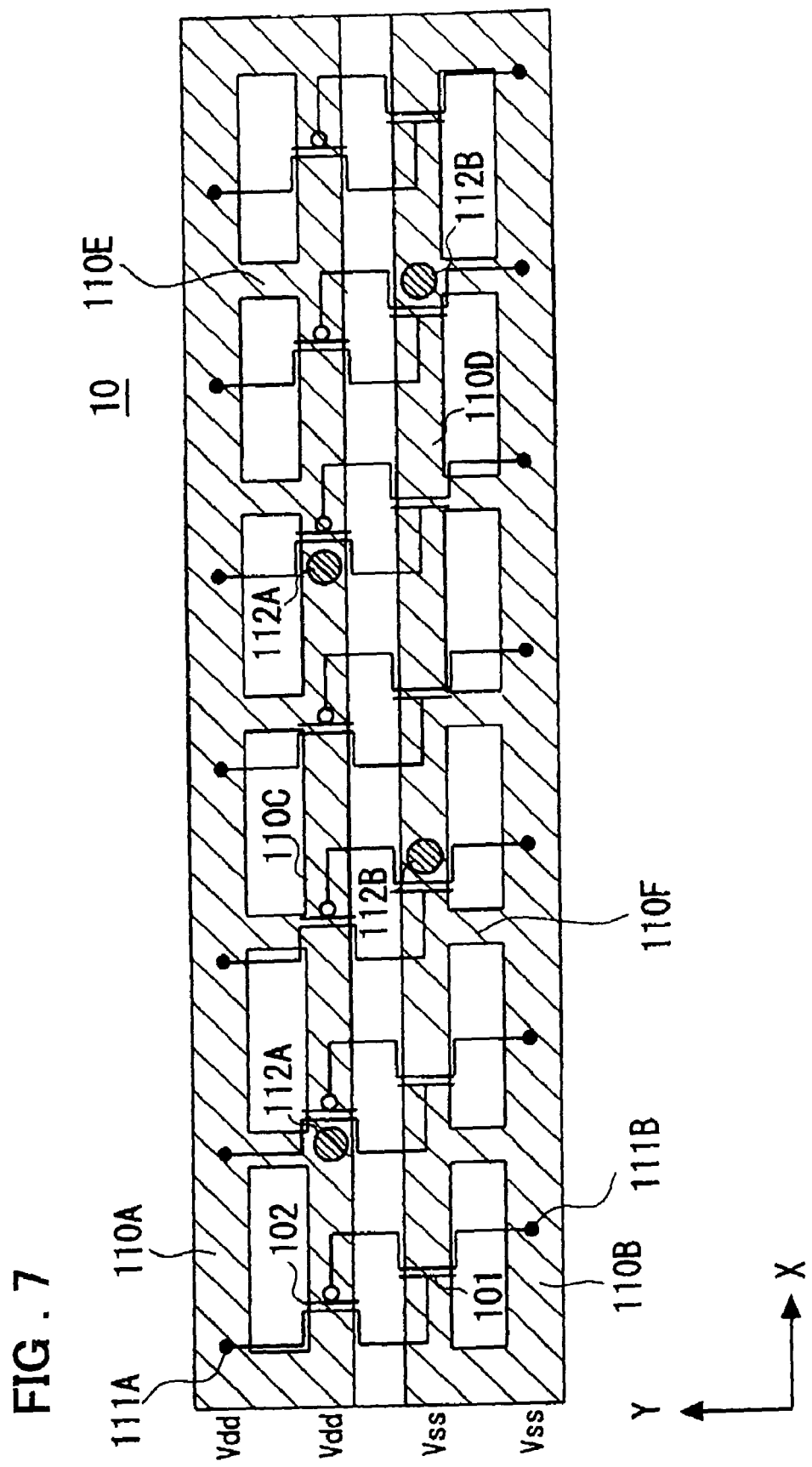
FIG. 7 is a view showing a layout pattern of a interconnection layer on the capacitor cell of a third embodiment of the present invention.
Figure 8:
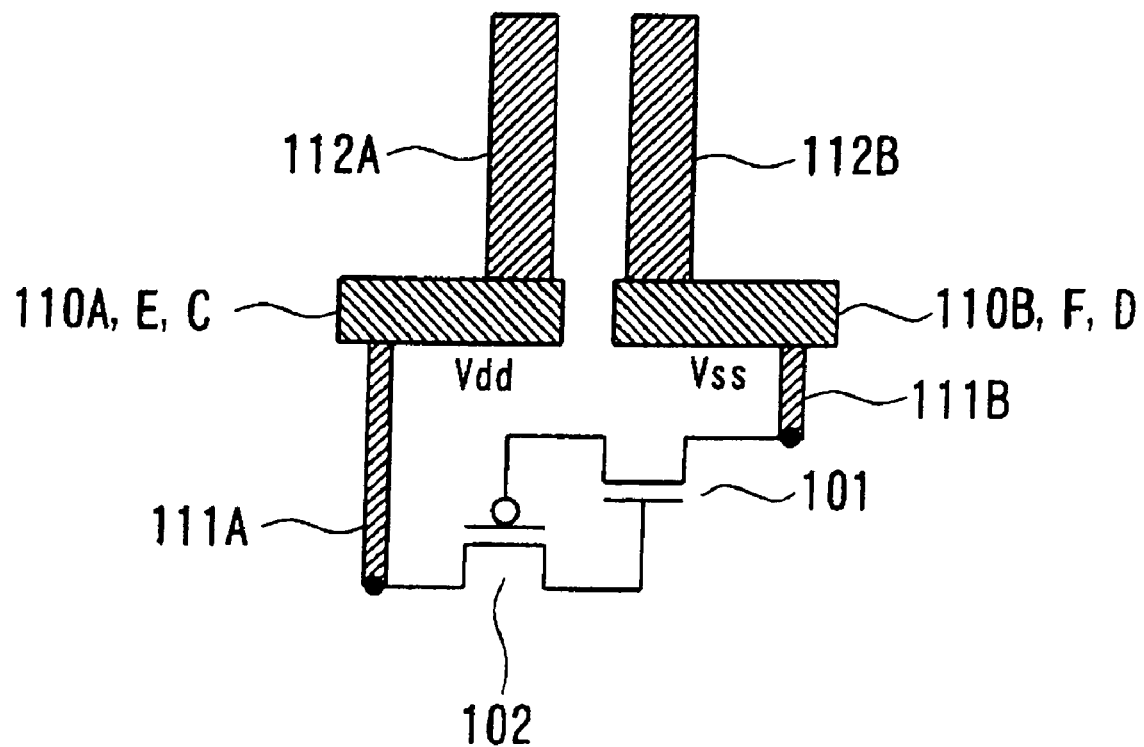
FIG. 8 is a view schematically showing the configuration and arrangement of vias and contacts of FIG. 7.

Now, a third embodiment of the present invention will be described. FIG. 7 is a view showing an arrangement of the third embodiment of the present invention. Layout patterns (Vdd and Vss enhancing patterns) of the power supply line provided on the metal interconnection layer (for example, first metal interconnection layer) just above the capacitor cell is illustrated in FIG. 7. FIG. 8 is an explanatory view schematically showing the sectional structure of vias as viewed in an X-axis direction from the left side of FIG. 7.

Referring now to FIG. 7, the power supply line pattern of the first metal interconnection layer on the capacitor pattern 10 has two rows of interconnection patterns 110A and 110C which extend and are separated to each other at a given space and extend in a row direction as a pattern for enhancing higher voltage power supply Vdd and comprises a plurality of bias 112A which are separated to each other in a row direction for connecting the interconnection pattern 110C on the second row to the upper power supply line (not shown). The interconnection patterns 110A and 110C are connected to each other by a plurality of patterns 110E extending in a column direction (Y-axis direction in the drawing). The present embodiment has the interconnection patterns 110B and 110D of two rows which extend in a row direction and are separated to each other at a given space and comprises a plurality of bias 112B which are spaced in a row direction for connecting the interconnection pattern 110D to the upper layer power supply line (not shown). The interconnection patterns 110B and 110D are connected to each other by a plurality of interconnection patterns 110F extending in a Y-axis direction in the drawing. The position of the via 112A on the power supply line pattern 110C of the higher voltage power supply Vdd in a row direction (X-axis direction) and the position of the via 112B on the power supply line pattern 110D of the lower voltage power supply Vss in a row direction (X-axis direction) are determined so that they correspond to the positions of the power supply lines of the higher and lower voltage power supplies Vdd and Vss of the upper interconnection layer, respectively. The power supply lines of the higher and lower voltage power supplies Vdd and Vss of the upper interconnection layer extend in a Y-axis direction of FIG. 7 in a parallel manner.

Referring now to FIGS. 7 and 8, the source diffusion region of the PMOS transistor 102 and the source diffusion region of the NMOS transistor 101 which constitute a MOS gate capacitor are connected to the higher voltage power supply line (Vdd) 110A and the lower voltage power supply line (Vss) 110B which are disposed on the first metal interconnection layer via contacts 111A and 111B, respectively. The power supply line 110C of the higher voltage power supply Vdd and the power supply line 110D of the lower voltage power supply Vss are connected to the upper layer power supply line (not shown) through vias (through-holes) 112A and 112B which form paths to reduce the resistance of power supply paths, respectively.

The present embodiment comprises a plurality of vias which connect the higher and lower voltage power supplies disposed on the metal interconnection layer just above the gate capacitor cell to corresponding power supply lines of the upper interconnection layer, so that the interconnection resistance of respective power supply lines is reduced.

Figure 9:
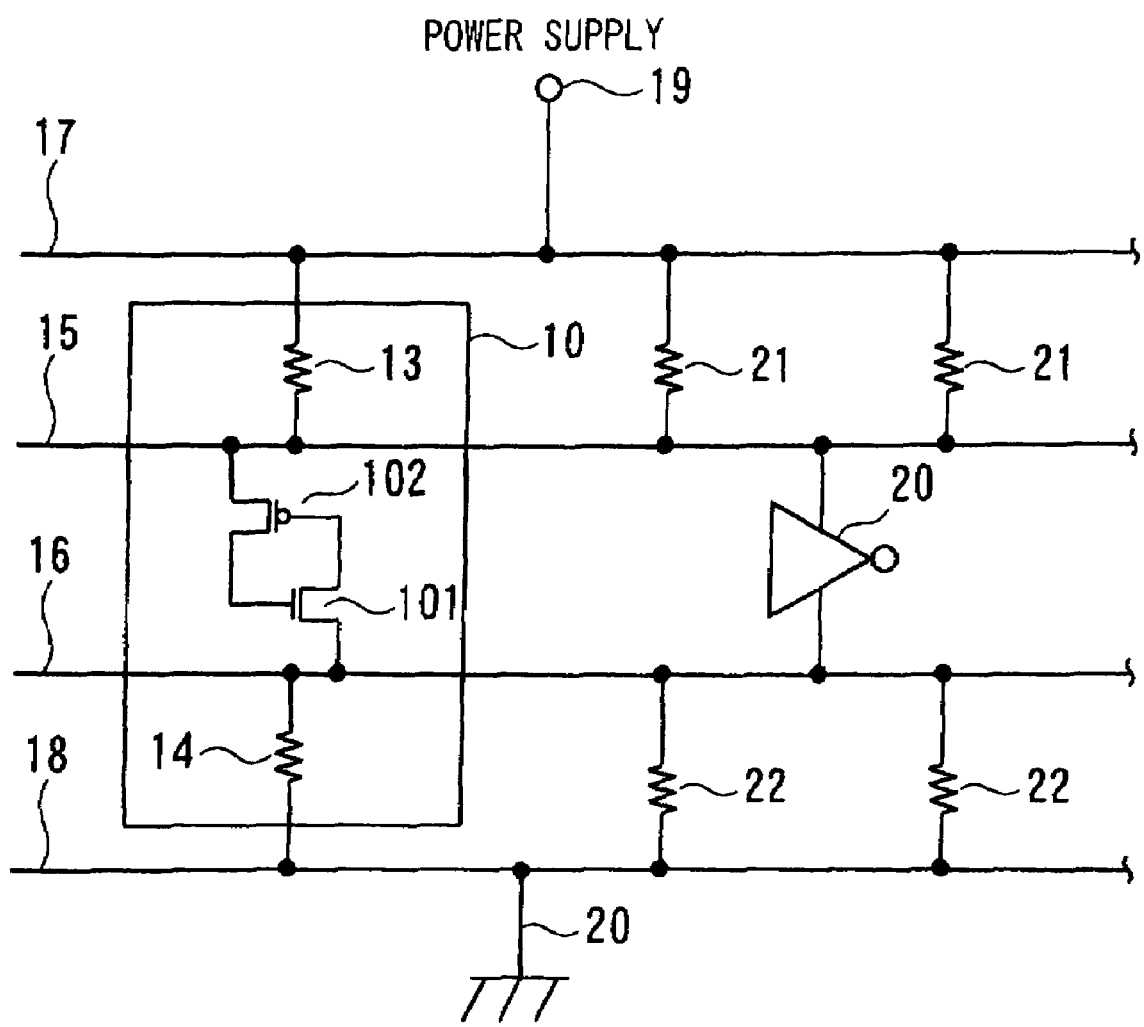
FIG. 9 is a view showing an exemplary configuration of a circuit using a capacitor cell of a fourth embodiment of the present invention.

Now, a fourth embodiment of the present invention will be described. FIG. 9 is a view showing the circuit configuration of a part of a semiconductor device including a capacitor cell with a resistance mitigating paths of the present invention. In FIG. 9, the capacitor cell 10 which is shown in FIG. 2 is disposed between the higher voltage power supply line (Vdd) 15 and the lower voltage power supply line (Vss) 16 of the lower interconnection layer. In FIG. 9, reference numerals 17 and 18 denote a higher voltage power voltage supply line (Vdd) and a low voltage power supply line (Vss), respectively, above the lower interconnection layer on which the power supply lines 15 and 16 are disposed and the power supply lines (Vdd) and (Vss) are connected to, for example, an external electrode of a semiconductor chip. Resistors 13 and 14 designate interconnection resistance of vias (or stacked vias) which connect the higher voltage power supply line (Vdd) 17 and lower voltage power supply line (Vss) 18 of the upper interconnection layer to the higher voltage power supply line (Vdd) 15 and lower voltage power supply line (Vss) 16 of the lower layer, respectively.

The higher voltage power supply line (Vdd) 15 and the lower voltage power supply line (Vss) 16 on the metal interconnection layer provided above the capacitor cell 10 are electrically connected to contact areas (terminals) of the higher voltage power supply (Vdd) and lower voltage power supply (Vss) of the cell 20, respectively, the power supply of which is to be enhanced by the capacitor cell 10.

The contact areas of the higher and lower voltage power supplies (Vdd) and (Vss) of the cell 20 are supplied with power through a via (or stacked via) 21 and via (or stacked via) 22 from the higher and lower voltage power supply lines (Vdd) 17 and (Vss) 19 of the upper interconnection layer, respectively. In FIG. 9, the via (or stacked via) 21 and via (or stacked via) 22 correspond to the configuration of the power supply line for supplying power to the cell 20. Resistors 13 and 14 which are provided in the capacitor cell 10 designate paths for reducing the resistance, which are provided in the capacitor cell of the present invention. In the semiconductor device of the present invention, power is supplied to cell 20 through the higher and lower voltage power supplies (Vdd) and (Vss) from the upper metal interconnection layer above the capacitor cell 10 which functions as a decoupling capacitor while the interconnection resistance of power paths is reduced.

Figure 10:
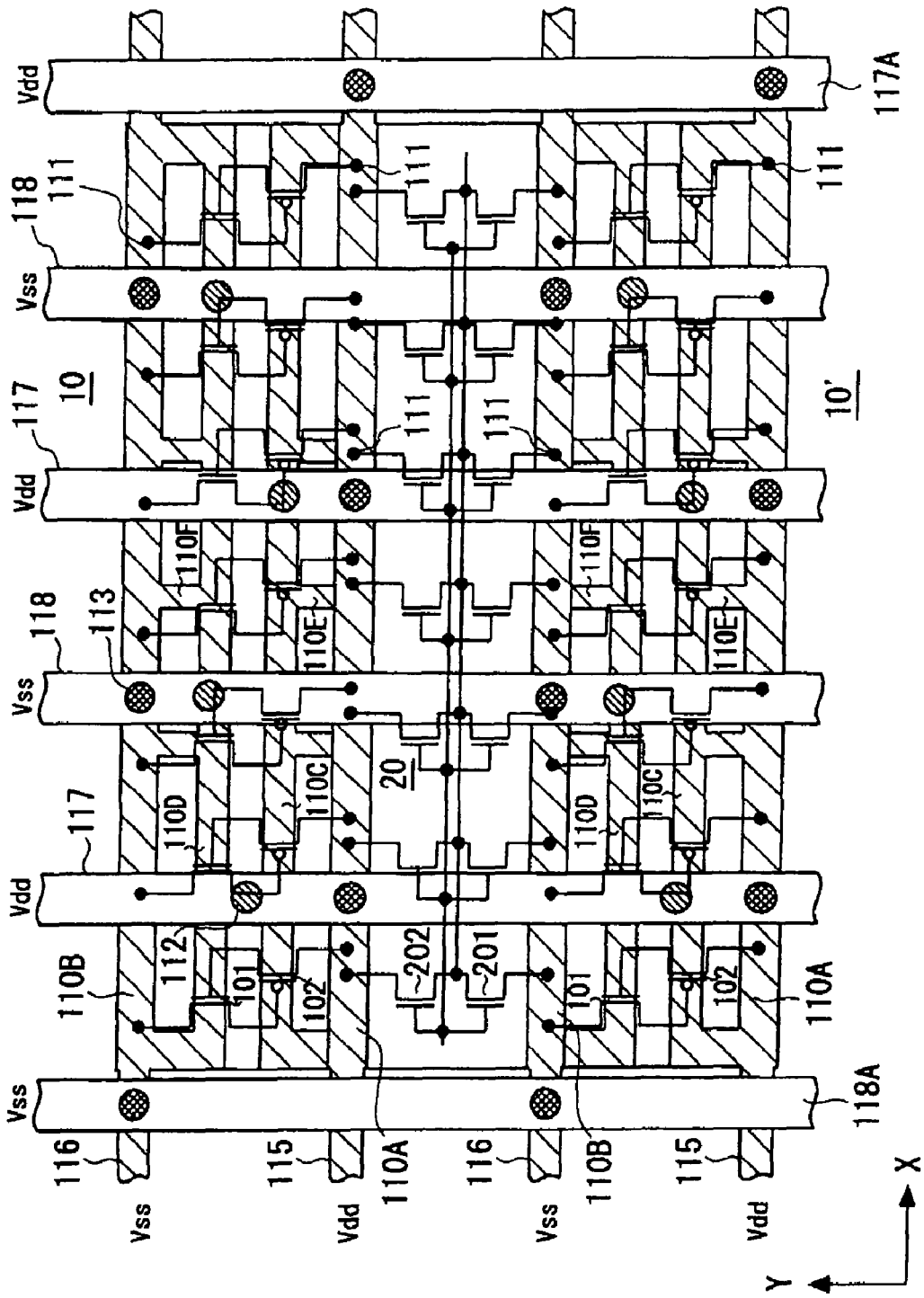
FIG. 10 is a view showing a layout pattern of a interconnection layer on the capacitor cell of a fifth embodiment of the present invention.
Figure 11:
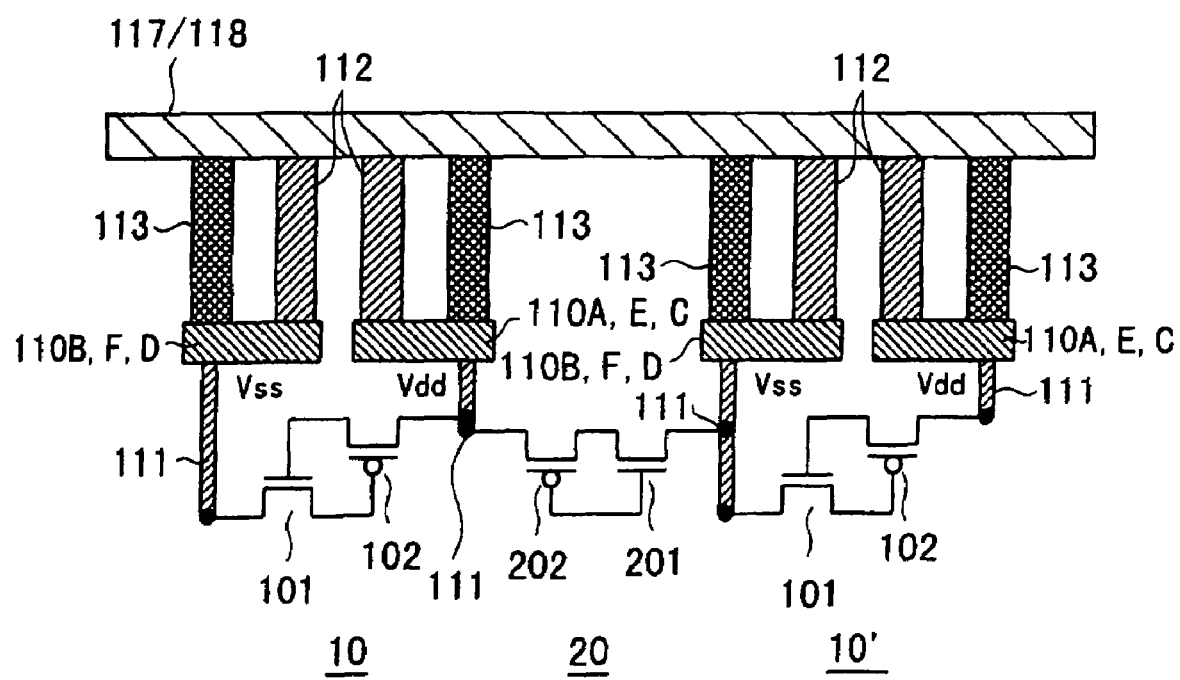
FIG. 11 is a view schematically showing the configuration and arrangement of vias and contacts of FIG. 10.

Now, a fifth embodiment of the present invention will be described. FIG. 10 is a view showing a layout of the fifth embodiment of the present invention. FIG. 11 is an explanatory view schematically showing the section of vias as viewed in an X-axis direction from one side (left side) of FIG. 10. As shown in FIG. 10, the cell 20 serves a high drive buffer in which a plurality of CMOS inverters are in parallel connected to each other, each inverter comprising an NMOS transistor 201 having its source connected to the ground and a PMOS transistor 202 having its source connected to the power supply, its drain connected to the drain of the NMOS transistor 201 and its gate connected to commonly connected to the gate of the NMOS transistor 201. The input terminals of the plurality of CMOS inverters are also commonly connected to each other.

The pattern of the capacitor cells 10 and 10' which are disposed on the upper and lower rows where the cell 20 is disposed in FIG. 10 is a pattern obtained by reversing up and down the pattern of the power supply line shown in FIG. 7. The lower and upper rows of two pairs of grid patterns of the resistance reducing circuit of the first metal interconnection layer having two rows and seven columns in FIG. 7 are higher and lower voltage power supply lines (Vdd) and (Vss), respectively. In FIG. 10, reference numerals 117 and 118 denote power supply lines of the upper power supply layer which extend in a direction (Y-axis direction in the drawing) which is perpendicular to the longitudinal direction (Y-axis direction in the drawing) of the power supply lines 110A, and 110B of the lower layer. The power supply lines 117 and 118 correspond to the higher and lower voltage power supply lines 17 and 18 of the upper layer of FIG. 9, respectively. In FIG. 10, reference numerals 115 and 116 denote power supply lines which extend from the power supply lines 110A and 110B of the lower layer and correspond to the higher and lower voltage power supply lines 15 and 16, respectively.

A via 113 (stacked via) which connects the power supply line (Vdd) 110A disposed on the lower interconnection layer such as the first metal interconnection layer and the like to the power supply line (Vdd) 117 on the upper interconnection layer constitutes a power supply path of the power supply line configuration (corresponding to the resistor 21 in FIG. 9).

Referring now to FIGS. 10 and 11, the interconnection pattern 110C on the capacitor cell 10 located on the upper row of the cell 20 is connected to the power supply line 117 of the upper interconnection layer through a via 112, for supplying the higher power supply voltage Vdd to the source of the PMOS transistor 202 of each CMOS inverter while reducing the resistance. The interconnection pattern 110D on the capacitor cell 10 of the lower row of the cell 20 is connected to the power supply line 118 of the upper interconnection layer through the via 112, for supplying the lower power supply voltage Vss of the source of the NMOS transistor 201 of each CMOS inverter while reducing the resistance.

As shown in FIGS. 10 and 11, the source diffusion regions of PMOS transistor 202 and NMOS transistor 201 each of circuits (a CMOS inverter in the illustrated case) connected in parallel are connected to the power supply line patterns 110A and 110B, respectively, by the contact 111. The source diffusion region of PMOS transistor 102 which constitutes a decoupling capacitor is connected to the vicinity of the source diffusion regions of PMOS transistors of each CMOS inverter, which are connected to each other in a parallel manner. The source diffusion region of NMOS transistor which constitutes a decoupling capacitor is connected to the vicinity of the source diffusion region of NMOS transistor of the CMOS inverter.

The upper layer power supply line (Vss) 18A, upper layer power supply line (Vdd) 117A and upper layer power supply line (Vss) 118, upper layer power supply line (Vdd) 117 which are disposed on the both sides of an area where the capacitor cell 10 is disposed correspond to the power supply interconnection pattern of the upper most layer and has a pattern corresponding to the power supply line configuration (power supply bus in a longitudinal direction). Since the present embodiment thus has a power supply pattern in the area of the capacitor cell 10 and allows the power supply bus to extend through the upper layer, it is not necessary to provide power supply lines having a larger width in the power supply busses (118A, 117, 118, and 117A in FIG. 10) which are provided in a longitudinal (column) direction of the power supply line configuration for the high drive cell 20.

Referring now to FIGS. 10 and 11, the source diffusion region of PMOS transistor 202 of CMOS inverter in the cell 20 is connected to the higher voltage power supply line 110A of the first metal interconnection layer by the contact 111. The power supply line 110C which connects to the power supply line 110A is connected to the higher voltage power supply line (Vdd) 117 of the upper interconnection layer by the via 112 which constitutes the resistance reducing path. The power supply line 110A is connected to the higher voltage power supply line (Vdd) 117 of the upper interconnection layer also by the via 113 which is provided as a power supply interconnection structure. The source diffusion region of NMOS transistor 201 of CMOS inverter in the cell 20 is connected to the lower voltage power supply line 110B of the first metal interconnection layer by the contact 111. The power supply line 110D which connects to the power supply line 110B is connected to the lower voltage power supply line (Vdd) 118 of the upper interconnection layer by the via 112 which constitutes the resistance reducing path. The power supply line 110B is connected to the lower voltage power supply line (Vss) 118 of the upper interconnection layer also by the via 113 which is provided as a power supply interconnection structure.

The source diffusion region of NMOS transistor 101 of the first capacitor cell 10 which constitutes the decoupling capacitor of the cell 20 is connected to the power supply line 110B of the first metal interconnection layer by the contact 111 as mentioned above. The power supply line 110B of the first metal interconnection layer is connected to the power supply line (Vss) 118 of the upper interconnection layer by the vias 112 and 113. The source diffusion region of PMOS transistor 102 is connected to the power supply line 110A of the first metal interconnection layer by the contact 111 as mentioned above. The power supply line 110A of the first metal interconnection layer is connected to the power supply line (Vdd) 117 of the upper interconnection layer by the vias 112 and 113.

The source diffusion region of PMOS transistor 102 of the first capacitor cell 10' which constitutes the decoupling capacitor of the cell 20 is connected to the power supply line 110A of the first metal interconnection layer by the contact 111 as mentioned above. The power supply line 110A of the first metal interconnection layer is connected to the power supply line (Vdd) 117 of the upper interconnection layer by the vias 112 and 113. The source diffusion region of NMOS transistor 101 is connected to the power supply line 110B of the first metal interconnection layer by the contact 111 as mentioned above. The power supply line 110B of the first metal interconnection layer is connected to the power supply line (Vss) 118 of the upper interconnection layer by the vias 112 and 113.

Figure 12:
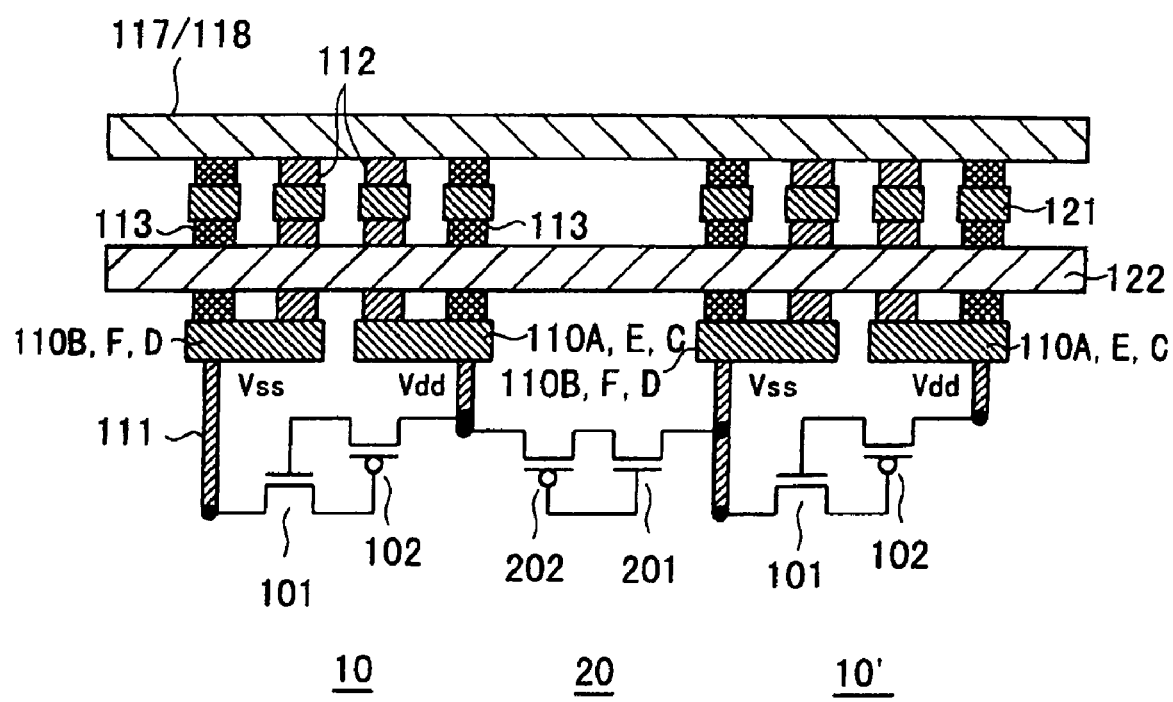
FIG. 12 is a view schematically showing the configuration and arrangement of vias and contacts of FIG. 10.

FIG. 12 is a view explaining a modification of the embodiment shown in FIG. 11. In the embodiment of FIG. 11, the first metal interconnection layer is connected to the upper interconnection layer by the stacked via. The first metal interconnection layer may be connected to the upper interconnection layer by a combination of a via and interconnection, rather than the stacked via. In FIG. 12, two interconnection layers 121 and 122 are provided between the first metal interconnection layer and the upper layer interconnection layer. The first metal interconnection layer is connected to the relay connection line on the second metal interconnection layer 122 through a via. The relay connection line on the second metal interconnection layer 122 is connected to the relay connection line on the third metal interconnection layer 122 through a via and then connected to the power supply line 117/118 on the fourth metal interconnection layer through the via.

Figure 13:
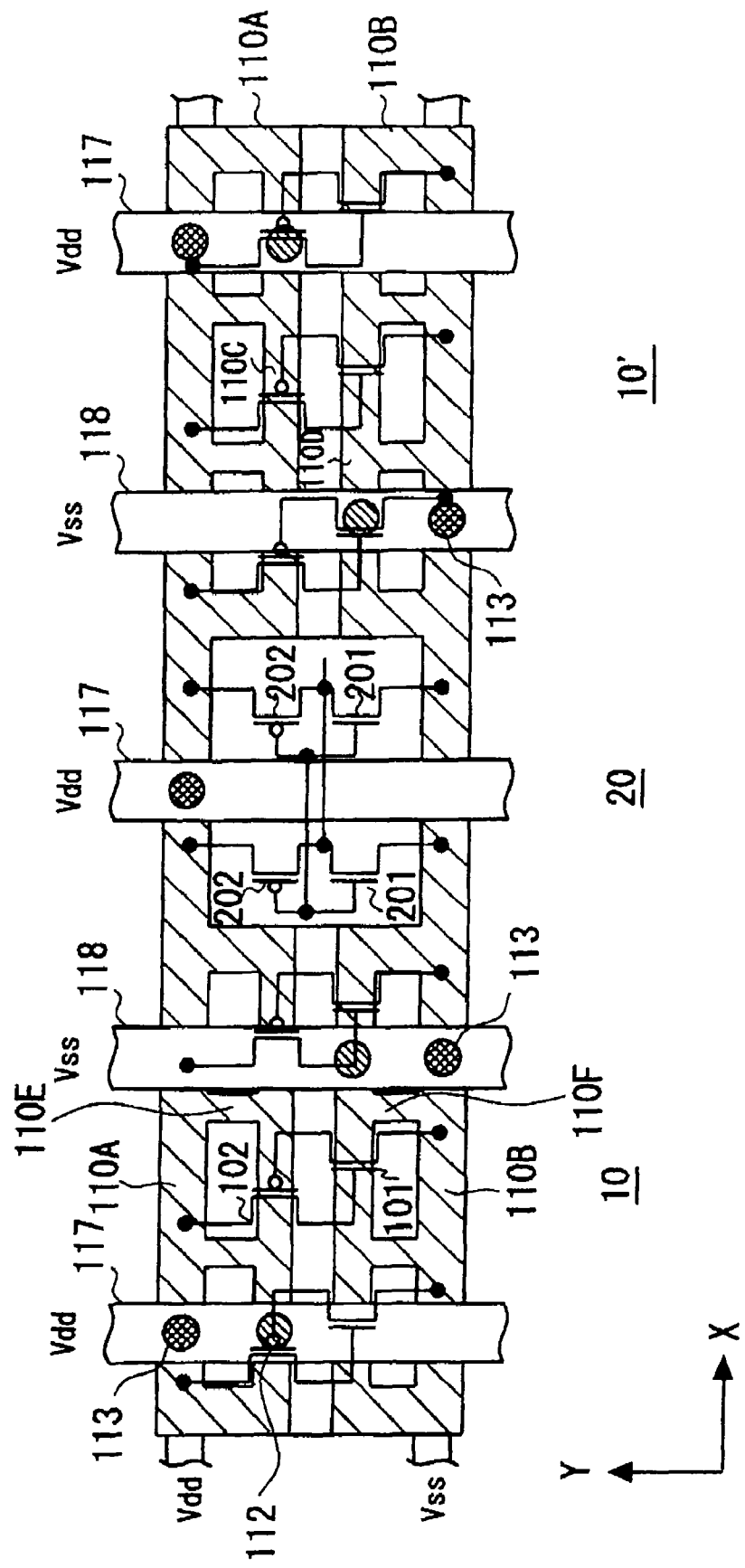
FIG. 13 is a view showing a layout pattern of an interconnection layer on the capacitor cell of a sixth embodiment of the present invention.

FIG. 13 is a view showing the configuration of a sixth embodiment of the present invention. In FIG. 13, the layout pattern of the power supply line which is provided on the metal interconnection layer (for example, the first metal interconnection layer) right over the capacitor cell is illustrated.

Referring now to FIG. 13, a capacitor cell is disposed on each of the right and left columns on the same row as the cell 20. The power supply line pattern of the upper metal interconnection layer above the capacitor cell 10 comprises grid like patterns made up of four rows and four columns in which upper half two rows and four columns are used for enhancement of Vdd and lower half two rows and four columns are used for enhancement of Vss.

In FIG. 13, reference numerals 117 and 118 denote power supply lines on the upper interconnection layer extending in a direction perpendicular to the power supply lines 110A and 110B on the lower interconnection layer.

A lower power supply voltage (Vss) is supplied to the source of NMOS transistor 201 of each CMOS inverter through the via 112 which connects the power supply line 110B above the capacitor cells 10 and 10' of cell columns on the right and left sides of the cell 20 to the power supply line (Vss) 118 of the upper interconnection layer while the resistance of the power supply path is reduced. A higher power supply voltage (Vdd) is applied to the source of PMOS transistor 202 of each CMOS inverter through the via 112 which connects power supply line 110A above the capacitor cells 10 and 10' of cell columns on the right and left sides of the cell 20 to the power supply line (Vdd) 117 of the upper interconnection layer with the resistance of the power supply path being reduced. The via 113 which connects to the power supply line (Vdd) 117 of the upper interconnection layer is a via which is different from the resistance reducing path of the capacitor cell 10 and is a power supply via of the power supply interconnection structure.

The source diffusion regions of PMOS transistor 202 and NMOS transistor 201 composing each of CMOS inverters connected in parallel are connected to the power supply line patterns 110A and 110B, respectively, by the contact 111. The source diffusion region of PMOS transistor 102 which constitutes a decoupling capacitor is connected to the vicinity of the source of PMOS transistors 202 of each CMOS inverter, which are connected to each other in a parallel manner. The source of NMOS transistor which constitutes a decoupling capacitor is connected to the vicinity of the source diffusion region of NMOS transistor 201 of the CMOS inverter.

Figure 14:
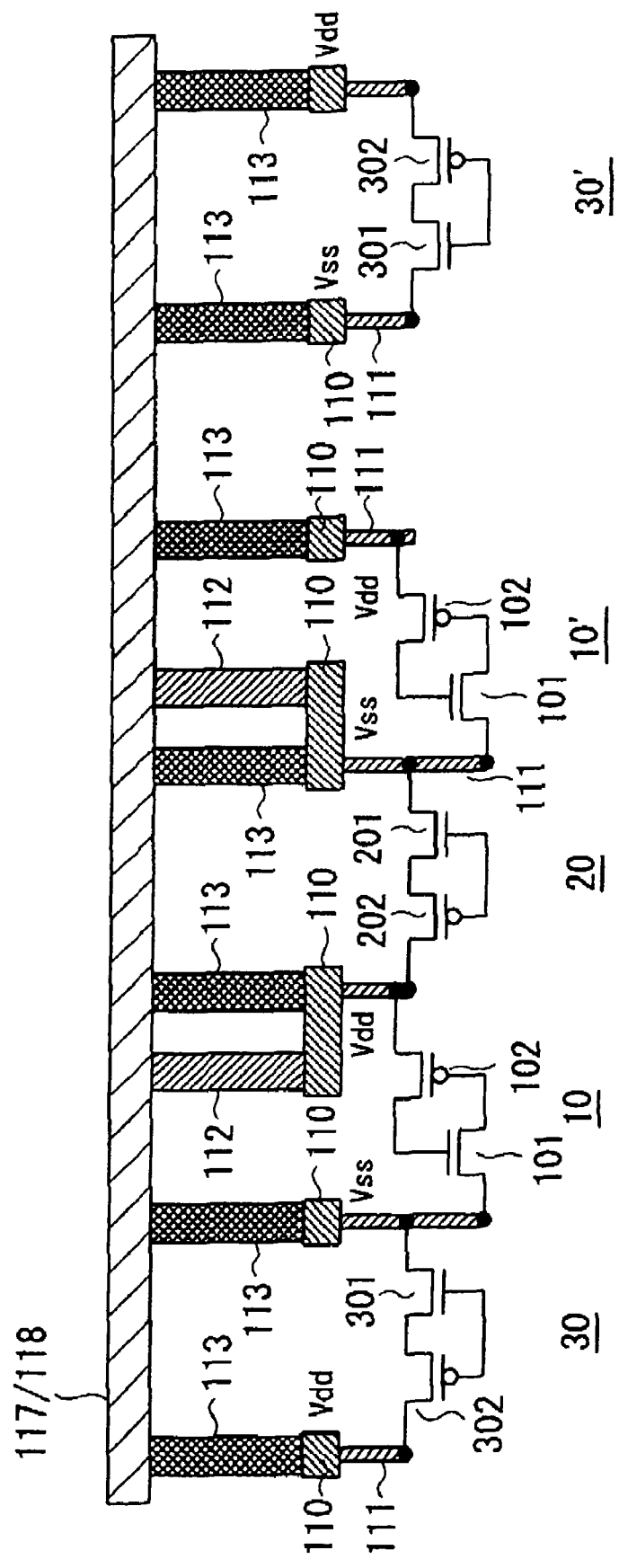
FIG. 14 is a view schematically showing the configuration and arrangement of vias and contacts of a seventh embodiment of the present invention.

FIG. 14 is a view schematically showing a configuration of seventh embodiment of the present invention in which there are arranged power supply lines for high drive cells having a high driving capability and cells having an average driving capability. Referring to FIG. 14, a cell 30 in the seventh embodiment has an average driving capability. Capacitor cells 10 and 10' with reduced resistance which have the vias 112 in the power supply line 110 on the first metal interconnection layer are disposed on the sides of the higher voltage power supply terminal (power supply contact) of the cell 20 and the lower voltage power supply terminal (power supply contact), respectively. In this embodiment, the capacitor cell with reduced resistance is the same as that which have been described with reference to FIGS. 3 and 4. Voltages are supplied to the higher and lower voltage power supply terminals of the cell 20 through the vias 113 which connect to the power supply line 117 and 118 of the upper layer, the first metal interconnection layer 110 and the contact 111. No capacitor cells with reduced resistance are not disposed between the higher and lower power supplies of the cells 30 and 30'.

Figure 15:
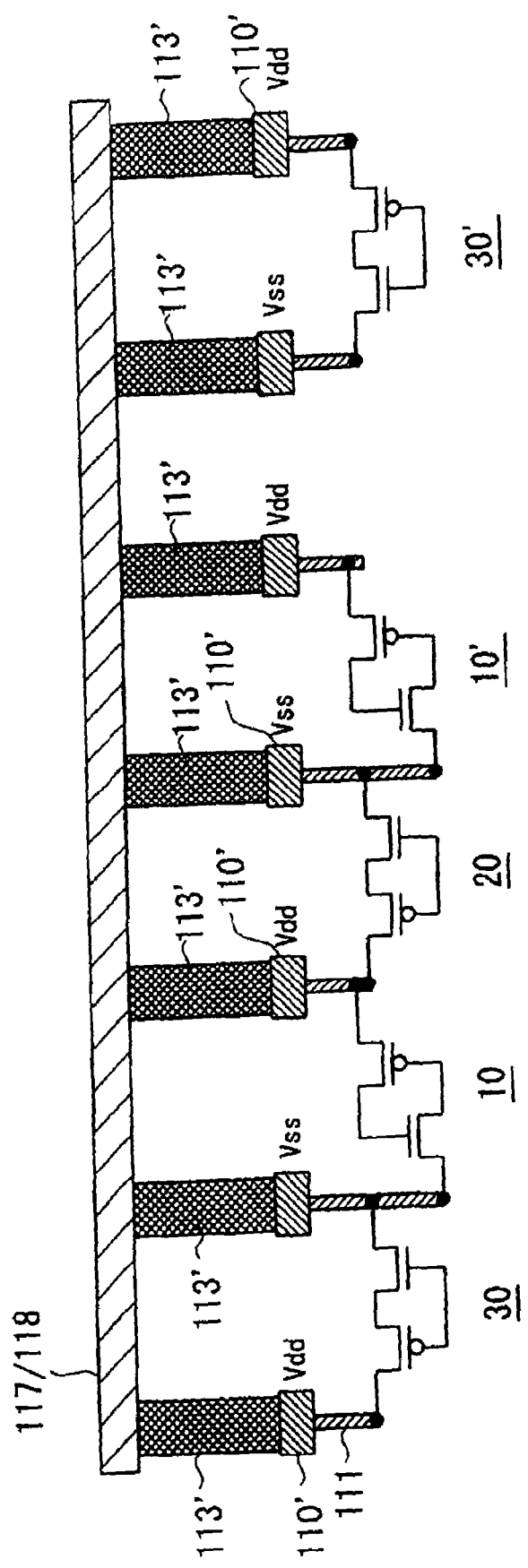
FIG. 15 is a view schematically showing an example of power supply structure which constitutes a control of an example shown in FIG. 14.

FIG. 15 is a view schematically showing an exemplary power supply interconnection structure which is adapted to the specifications of currents consumed by the high drive cells as a comparative example for the present invention. The high drive cell 20 is supplied with power through the vias 113' which connects to the upper power supply interconnection layers 117 and 118 and the power supply line 110' on the first metal interconnection layer. In the cells 30 and 30' having an average driving capability, the power supply line 110' on the first metal interconnection layer has a power supply configuration suited for the high drive cell 20, which is determined by the width of power supply line, the pitch of and the number of power supply vias, so that excessive power supply lines are disposed. It is found that the areas for signal interconnections are restricted.

In the present invention, capacitor cells 10 with reduced resistance are disposed only in the vicinity of high drive cells 20 for supplying power to the high drive cells 20. Since provision of excessively large power supply lines with respect to cells 30 having an average driving capability is prevented, restriction of the areas for signal interconnections is prevented.

Figure 16:
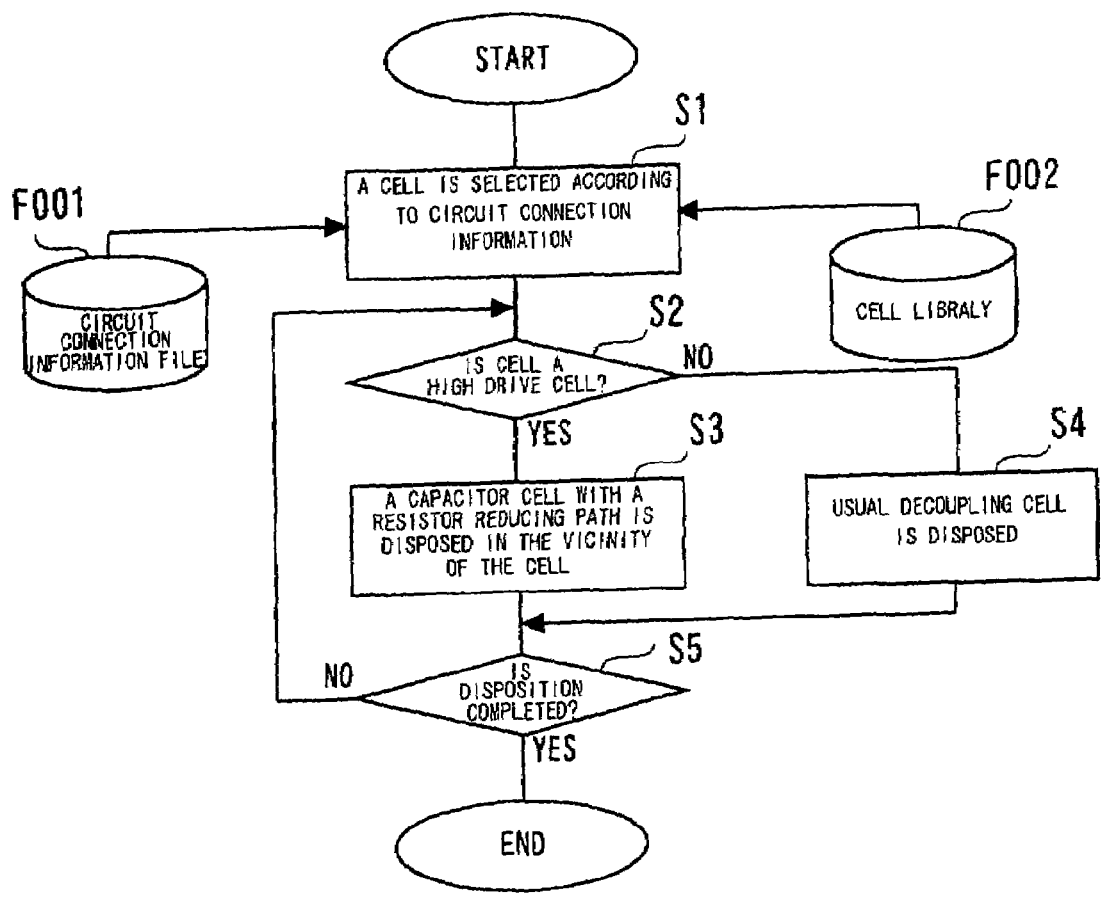
FIG. 16 is a flow chart explaining a process of an eighth embodiment of the present invention.

An eighth embodiment of the present invention will be described. The eighth embodiment of the present invention contemplates to conduct the layout of, for example a cell based designed LSI by using a computer composing a design automation system or a layout system. FIG. 16 is a flow chart explaining a process of the eighth embodiment of the present invention.

A capacitor cell, above which is provided at least one path for mitigating the resistance of the power supply path ("capacitor cell with a reduced resistance path") as a capacitor cell including a capacitor element for assisting in supplying power (also referred to as macrocell or primitive cell) (refer to FIGS. 2, 3, 5, 7) is registered in a cell library F002 of a storage device.

The information on circuit connection is read from a storage device (file) F001 which stores circuit connection information (net list) (step S1).

If the cell which is disposed in accordance with circuit connection information is a cell having a relatively high drive ability (YES branch at step S2), a capacitor cell with a resistance mitigating path which has been registered in a cell library F002 is placed adjacent to a cell as a capacitor cell which assists power supply to the cell (step S3).

If the cell in interest has an average driving capability (NO branch at step S2), a decoupling cell is placed according to needs (step S4). The above-mentioned steps are repeated until there is no cell to be placed. A result of placement of the cells is output to a layout result file (not shown).

An example of automatic placement of a capacitor cell has been described. In a modified embodiment, a resistance reducing pat may be placed on the upper layer above the capacitor cell from a terminal of a layout device by an operator manually in an interactive manner. In other words, the capacitor cell of the present invention can be preferably applied to the designing of cell based IC. It is of course that it may be applied to designing of LSI of full custom specifications.

In the foregoing embodiment, the metal interconnection layer in multi-layered interconnection structure is made of, for example, copper and the like. It may be made of Al and the like. The material of interconnection may be any metal. Although a MOS capacitor is used as a capacitor element which constitutes a capacitor cell in the above-mentioned embodiment, desired capacitor element such as parallel flat plate capacitor comprising an electrically conductive plate and a dielectric plate may be used.

The present invention has been described with reference to embodiments. It is to be noted that the present invention is not limited to only the foregoing embodiments. It is apparent to those skilled in the art that various modifications and alternations can be made within the spirit and scope of the present invention as set forth in the claims.

The meritorious effects of the present invention are summarized as follows.

In accordance with the present invention, an IR-drop can be effectively reduced without wasting space by providing with power supply resistance reducing path, a capacitor cell disposed in the vicinity of a cell having a high driving capability as mentioned above.

In accordance with the present invention, sufficient current can be supplied to high drive cell while noise such as ground bounces on high drive cell operation is reduced by means of a decoupling capacitor cell.

In accordance with the present invention, power supply interconnection adapted to power supply specifications is arranged without providing resistance reducing path for a cell having less driving capability, and hence space for interconnections of signals is not restricted to achieve reservation of interconnection resources and increasing of freedom in design.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
a capacitor cell formed on said semiconductor substrate, including at least one capacitor element;
one interconnection layer positioned over said capacitor cell;
at least one other interconnection layer different from said one interconnection layer, on which a power supply line is provided;
at least one power supply line disposed on said one interconnection layer at an area corresponding to the area at which said capacitor cell is placed, said power supply line being electrically connected to corresponding said power supply line on said other interconnection layer through at least one connecting via; and
a cell disposed in the vicinity of said capacitor cell having a circuit including at least one active element;

wherein said capacitor cell constitutes a decoupling capacitor of said cell disposed in the vicinity of said capacitor cell;

wherein said power supply line provided on said one interconnection layer at an area corresponding to the area where said capacitor cell is disposed constitutes a power supply path to said cell; and wherein said capacitor cell is placed on one or both sides of adjacent column on which said cell is disposed on the same row as the row on which said cell is disposed.

2. A semiconductor device comprising:

a capacitor cell formed on said semiconductor substrate, including at least one capacitor element;

one interconnection layer positioned over said capacitor cell;

at least one other interconnection layer different from said one interconnection layer, on which a power supply line is provided;

at least one power supply line disposed on said one interconnection layer at an area corresponding to the area at which said capacitor cell is placed, said power supply line being electrically connected to corresponding said power supply line on said other interconnection layer through at least one connecting via; and a cell disposed in the vicinity of said capacitor cell having a circuit including at least one active element;

wherein said capacitor cell constitutes a decoupling capacitor of said cell disposed in the vicinity of said capacitor cell;

wherein said power supply line provided on said one interconnection layer at an area corresponding to the area where said capacitor cell is disposed constitutes a power supply path to said cell;

wherein said cell comprises at least one higher voltage power supply terminal and at least one lower voltage power supply terminal on both side of a row on which said cell is disposed;

wherein said semiconductor device has said capacitor cell on at least one of two columns sandwiching said cell there between on the same row as that on which said cell is disposed; and wherein power is supplied to said higher and/or lower voltage power supply terminal of said cell through said power supply line provided on said one interconnection layer over said capacitor cell disposed area and is connected to higher and/or lower voltage power supply line of said other interconnection layer.

* * * * *